United States Patent [19]
D'Anna

[11] Patent Number: 6,063,678
[45] Date of Patent: May 16, 2000

[54] FABRICATION OF LATERAL RF MOS DEVICES WITH ENHANCED RF PROPERTIES

[75] Inventor: Pablo Eugenio D'Anna, Los Altos, Calif.

[73] Assignee: Xemod, Inc., Santa Clara, Calif.

[21] Appl. No.: 09/366,612

[22] Filed: Jul. 31, 1999

Related U.S. Application Data

[63] Continuation-in-part of application No. 09/293,431, Apr. 16, 1999, which is a continuation-in-part of application No. 09/072,393, May 4, 1998.

[51] Int. Cl.$^7$ .................................................. H01L 21/336

[52] U.S. Cl. .......................... 438/301; 438/197; 438/282; 438/289; 438/299; 438/301; 438/290; 438/291; 257/343; 257/328; 257/335

[58] Field of Search ...................................... 438/197, 282, 438/289, 299, 301, 290, 291; 432/44; 257/343, 328, 335

[56] References Cited

U.S. PATENT DOCUMENTS

| | | | |
|---|---|---|---|
| 4,890,146 | 12/1989 | Williams et al. | 357/23.8 |
| 4,906,589 | 3/1990 | Chao et al. | 437/44 |
| 5,071,777 | 12/1991 | Gahle | 437/29 |
| 5,514,608 | 5/1996 | Williams et al. | 437/44 |
| 5,760,440 | 6/1998 | Kitamura et al. | 257/328 |
| 5,900,663 | 5/1999 | Johnson et al. | 257/343 |
| 5,949,104 | 9/1999 | D'Anna et al. | 257/335 |

*Primary Examiner*—John F. Niebling
*Assistant Examiner*—Viktor Simkovic
*Attorney, Agent, or Firm*—Boris G. Tankhilevich

[57] ABSTRACT

Methods of fabrication of a lateral RF MOS device having a non-diffusion connection between source and substrate are disclosed. In one embodiment, the lateral RF MOS device has an interdigitated silicided gate structure. In another embodiment, the lateral RF MOS device has a quasi-mesh silicided gate structure. Both sides of each gate are oxidized thus preventing possible shorts between source and gate regions and between drain and gate regions. The top of each gate is silicided once the protective layer of silicon nitride is removed.

7 Claims, 10 Drawing Sheets

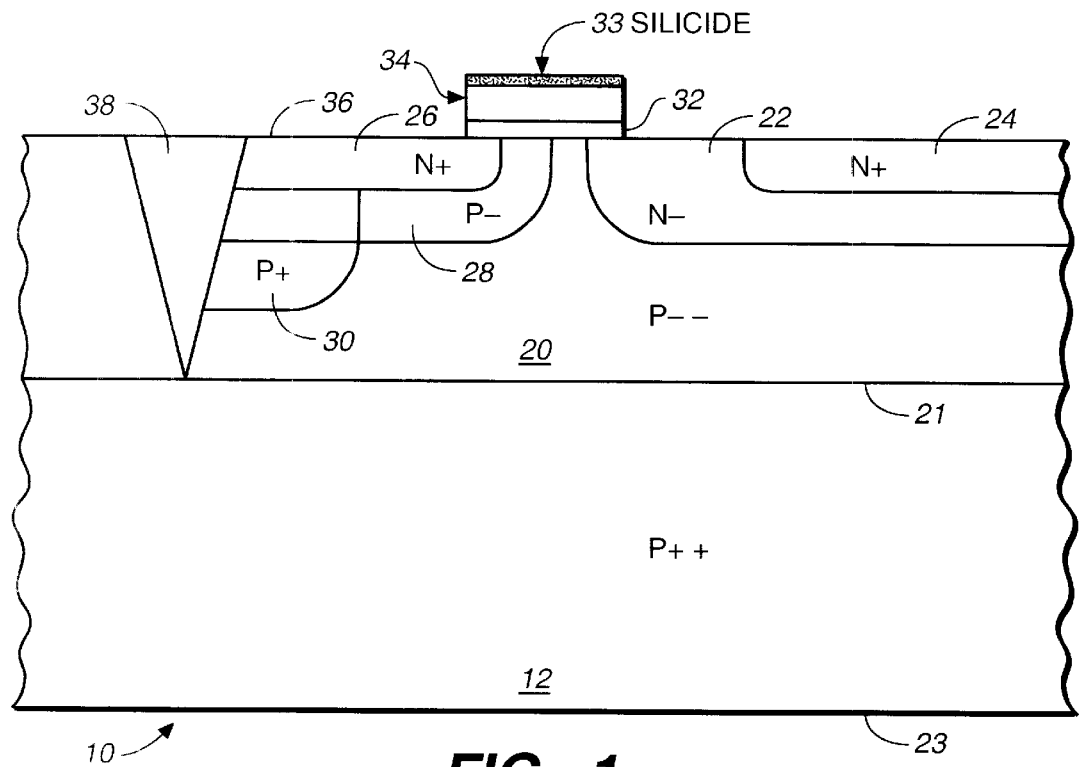
FIG._1
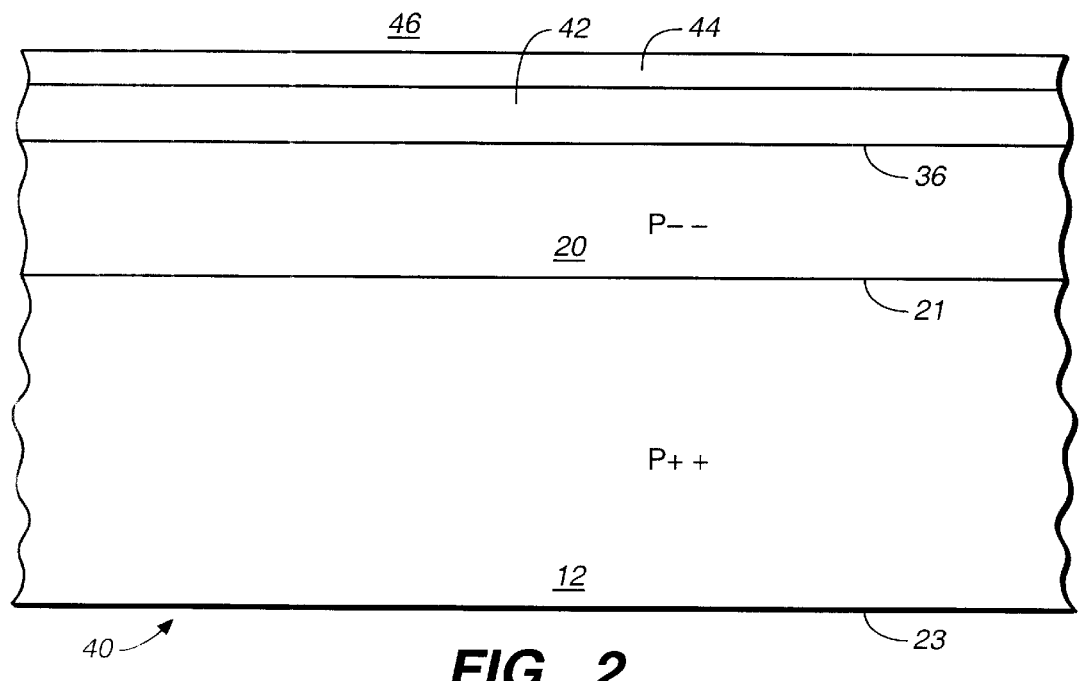
FIG._2

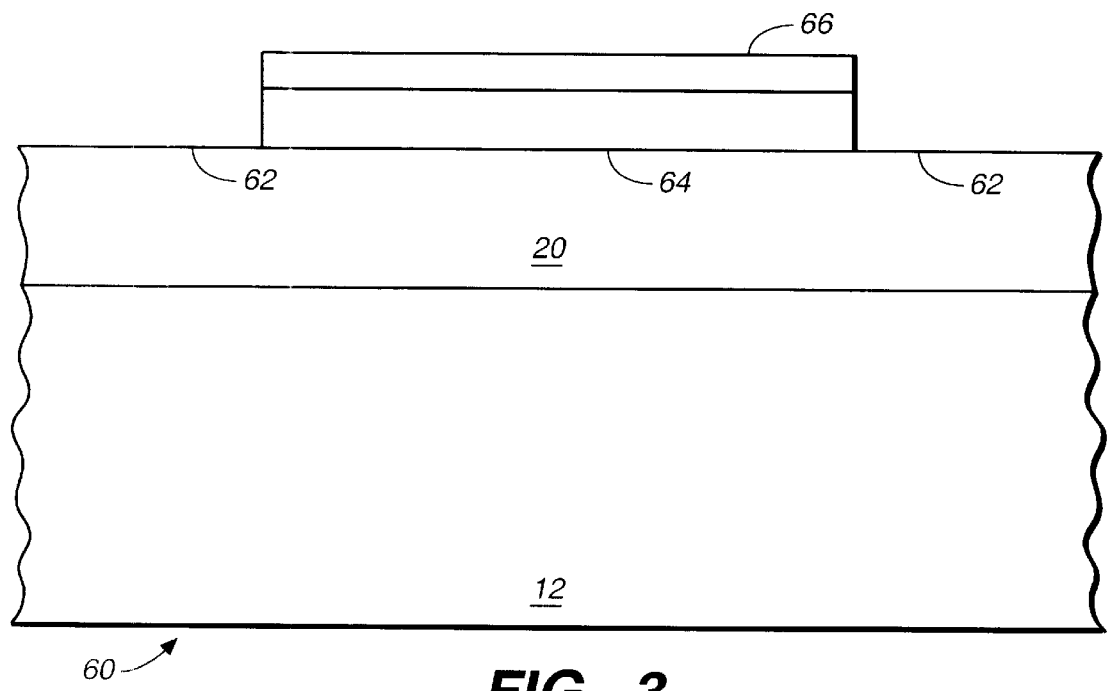
FIG._3
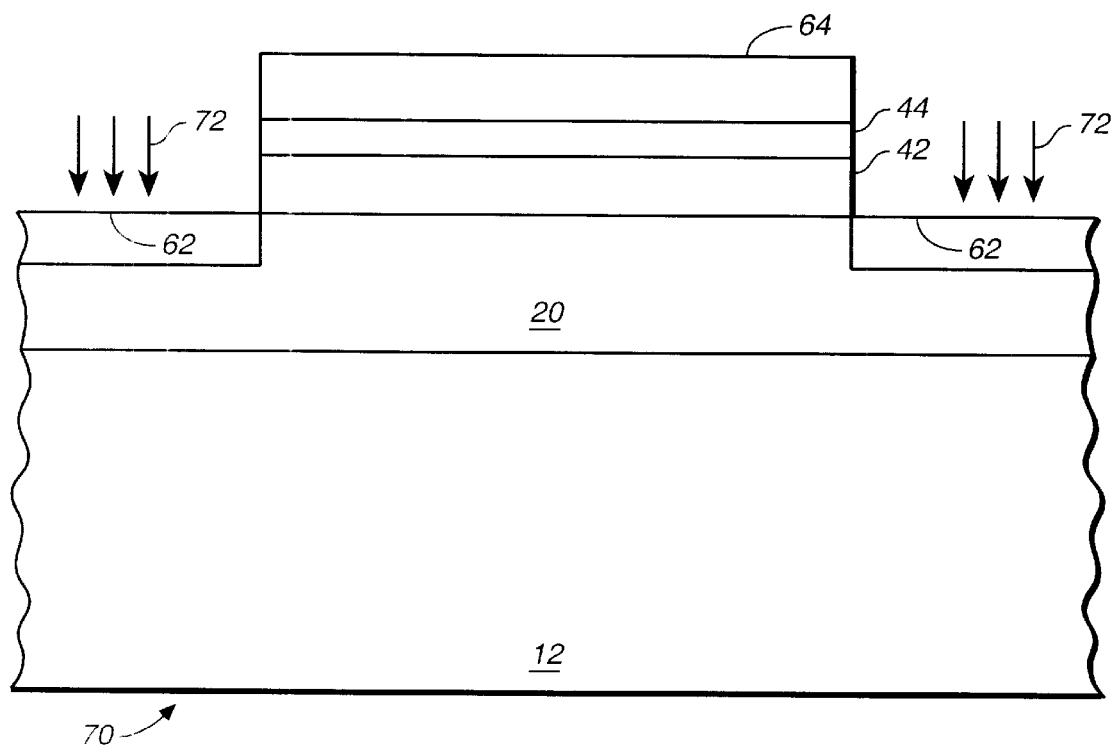
FIG._4

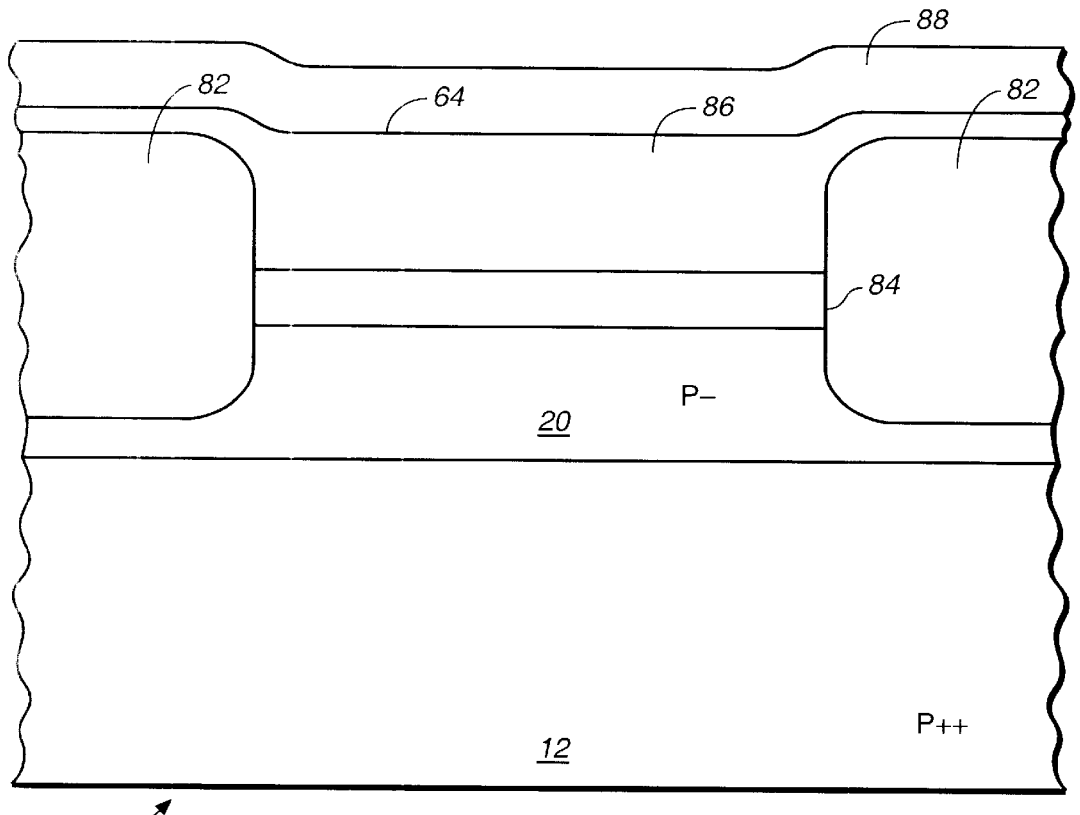
FIG._5
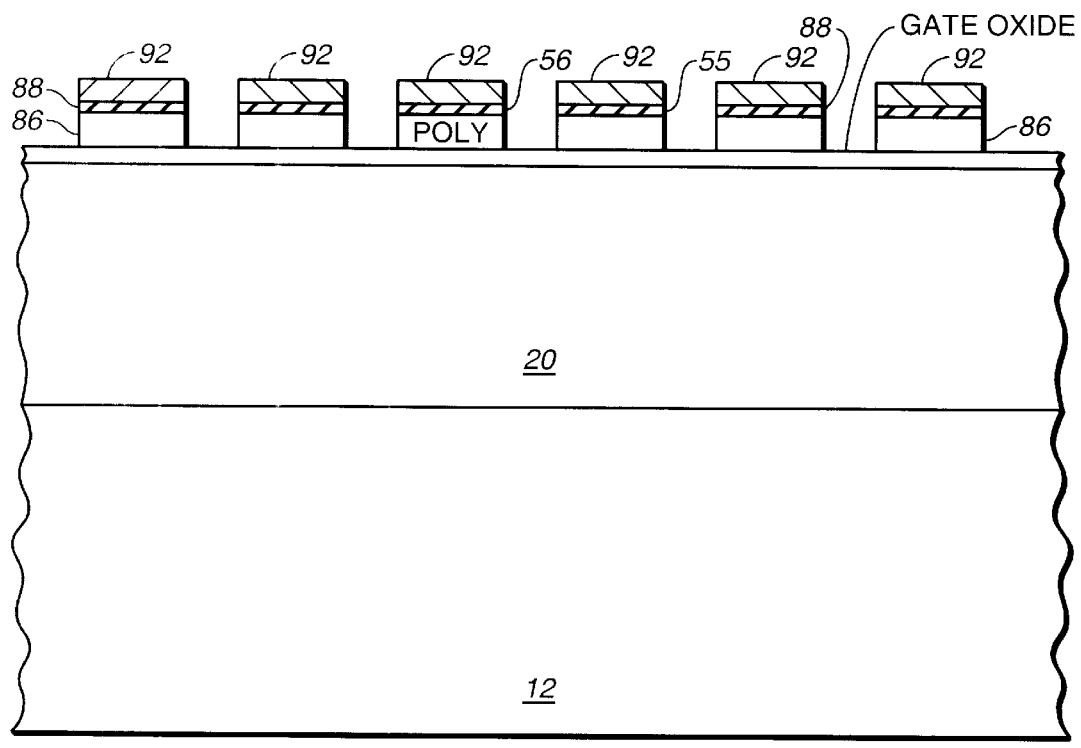
FIG._6

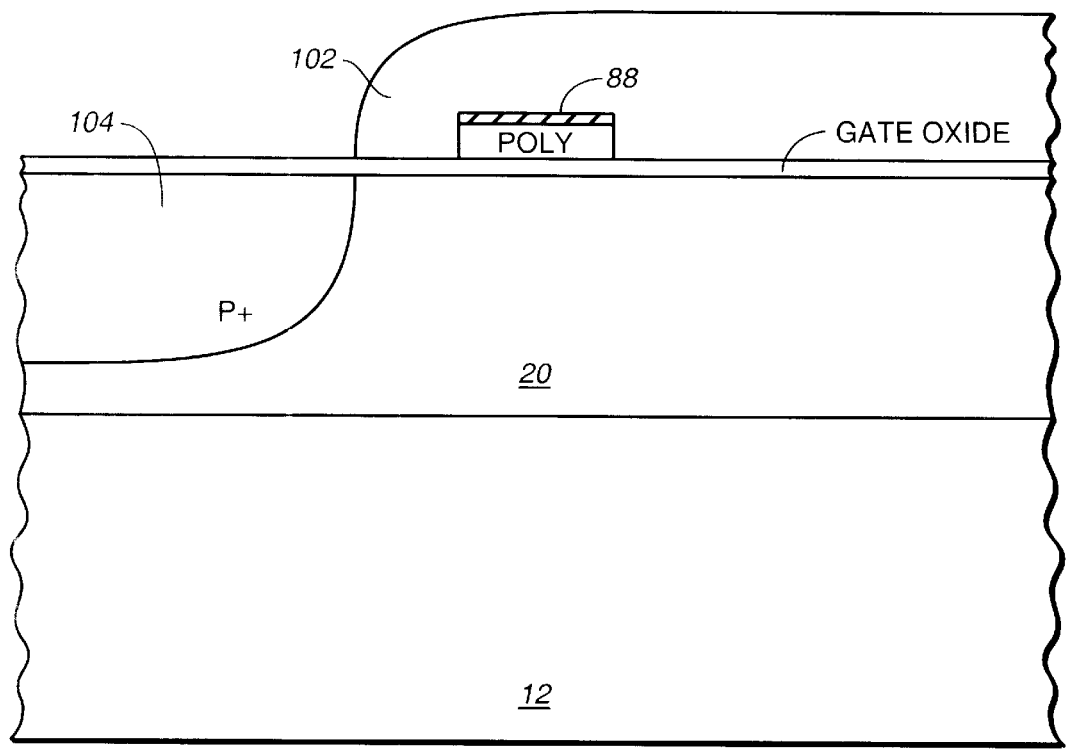
FIG._7
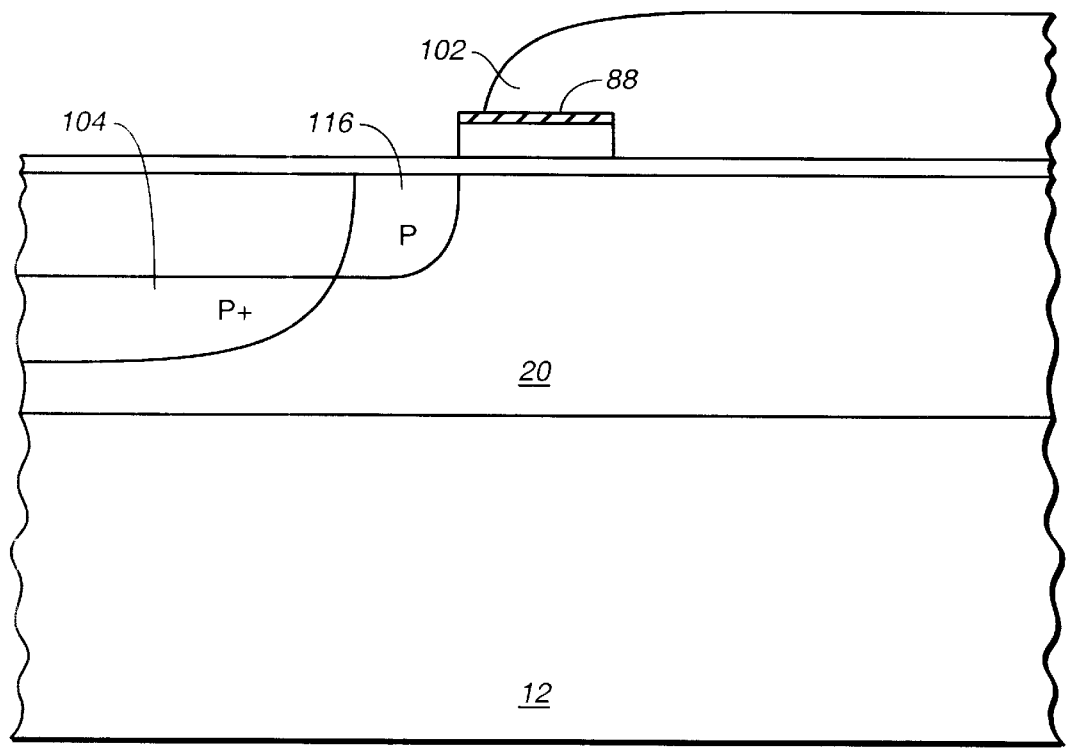
FIG._8

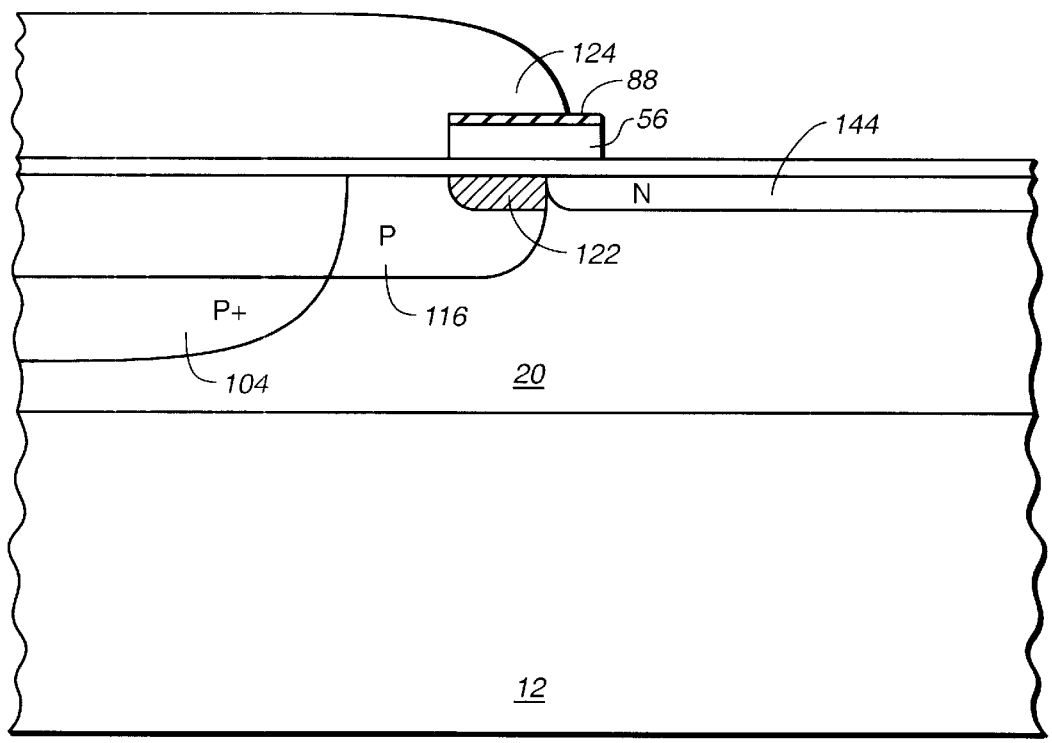
FIG._9
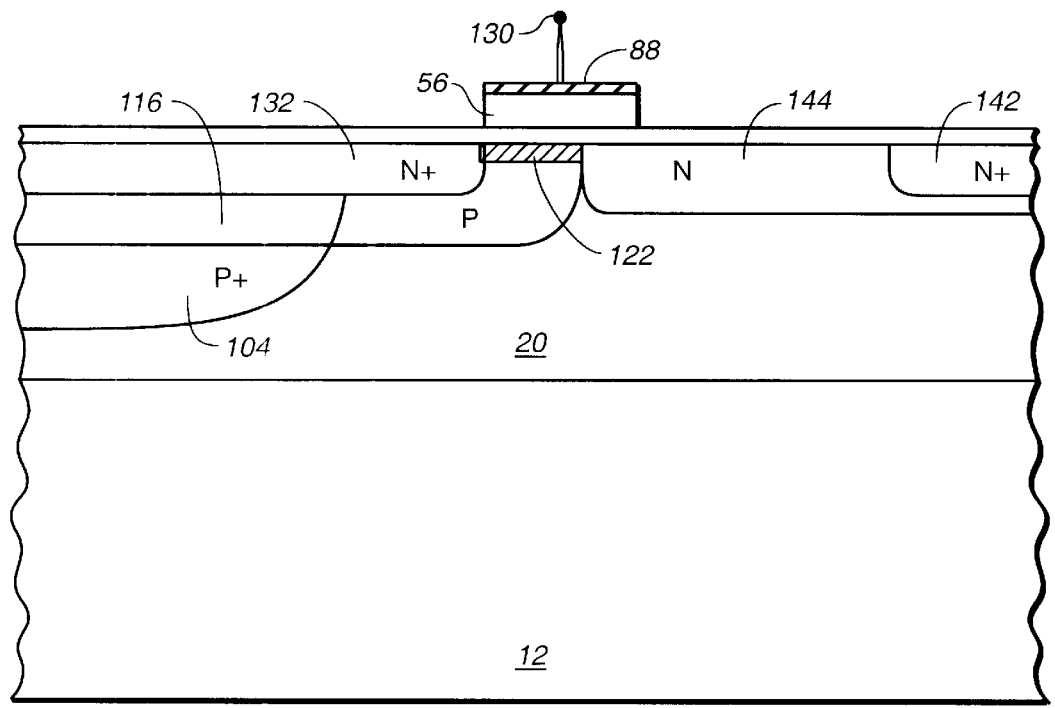
FIG._10

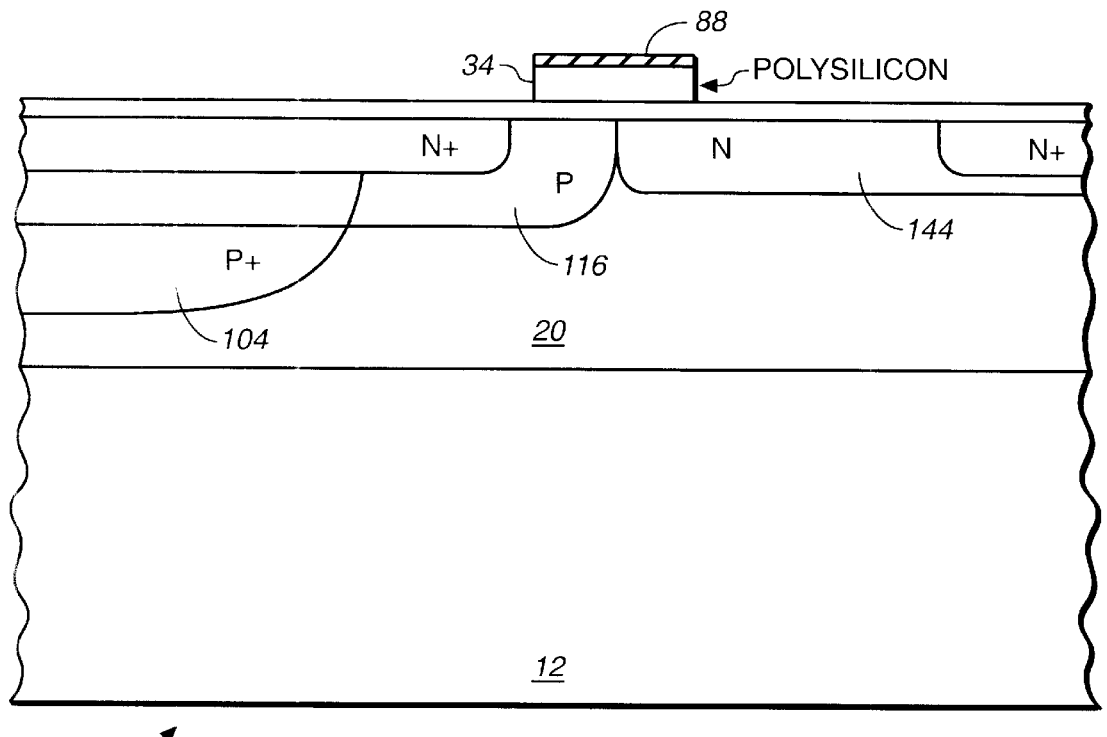
FIG._11
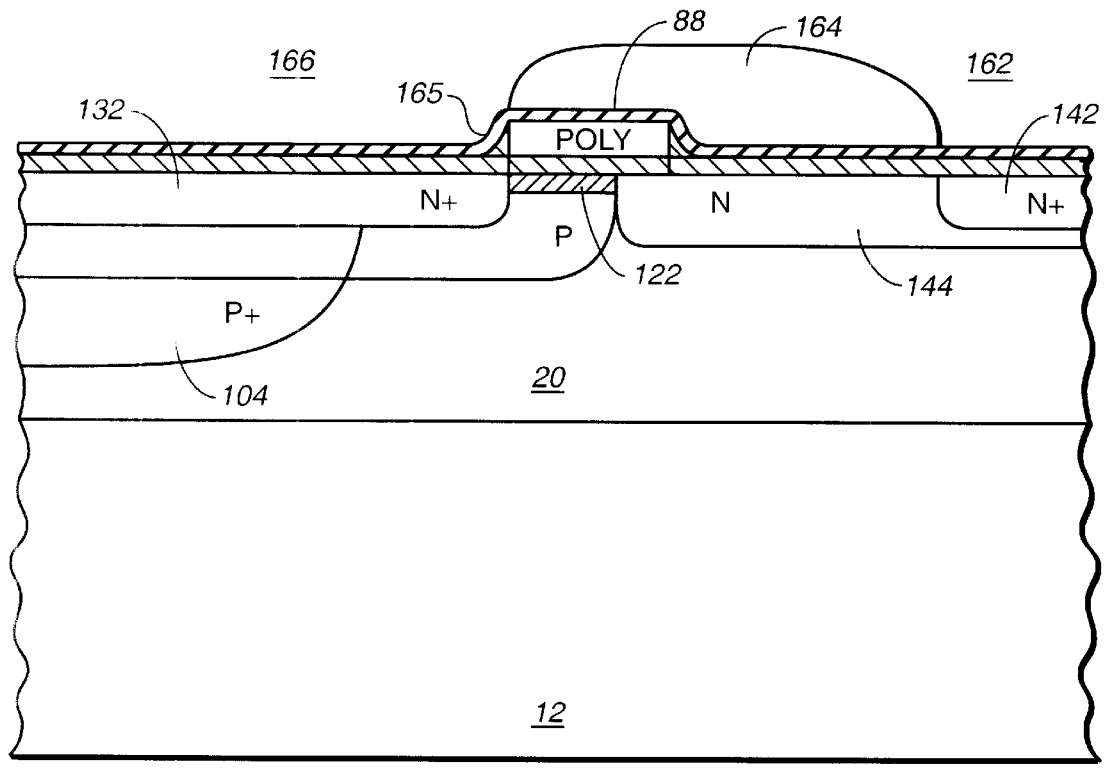
FIG._12

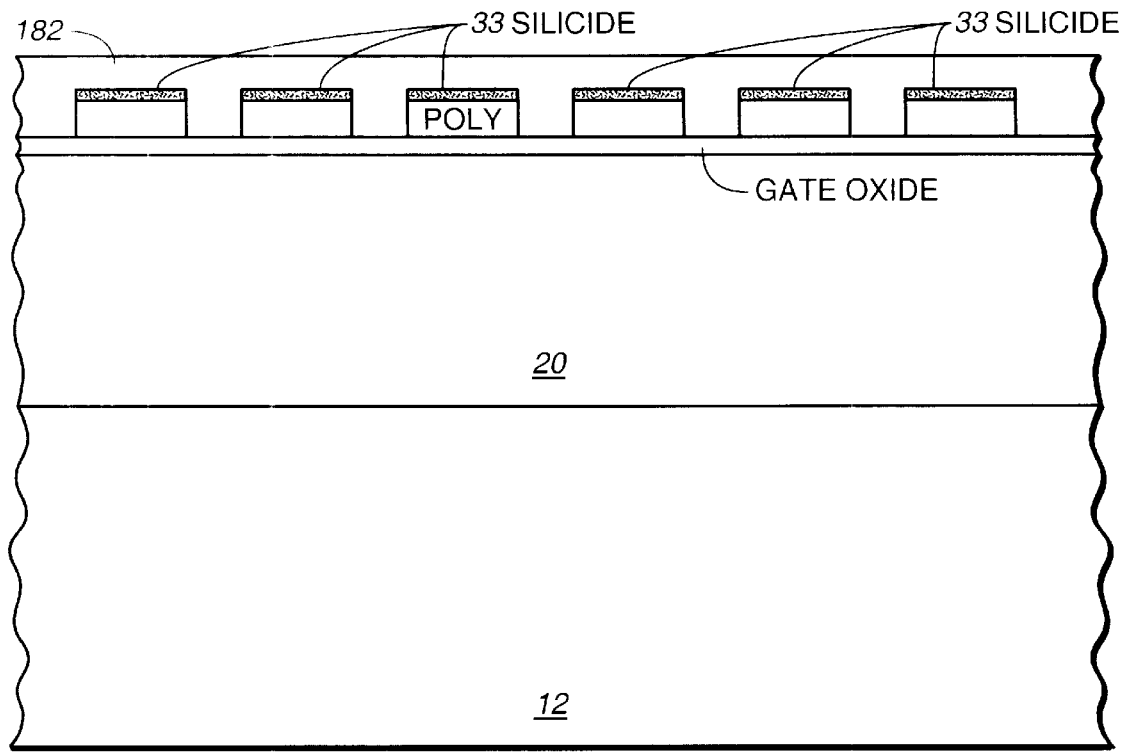
FIG._13
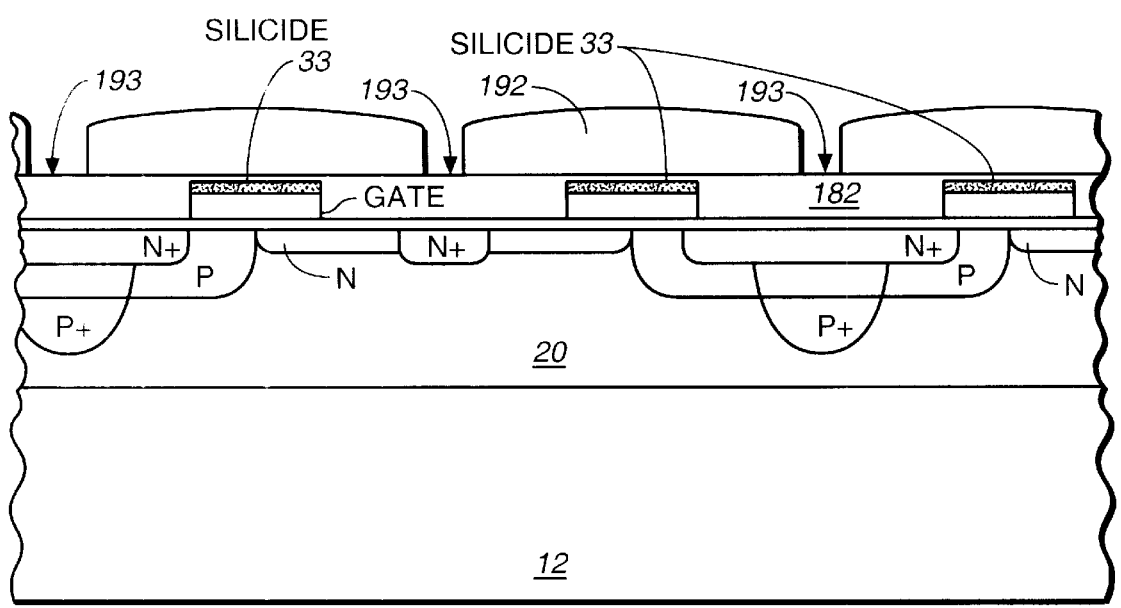
FIG._14

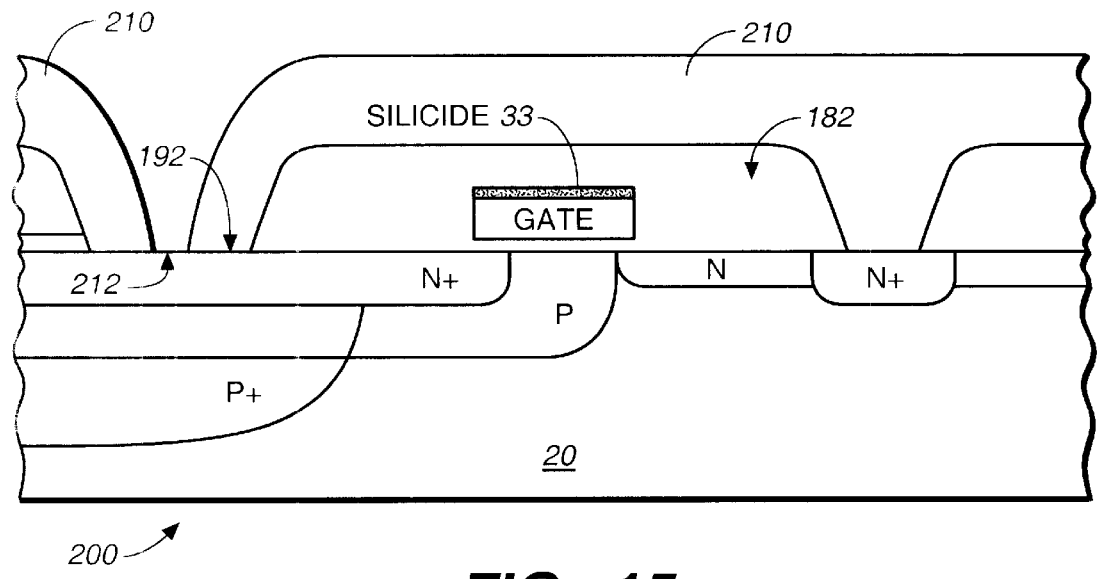
FIG._15
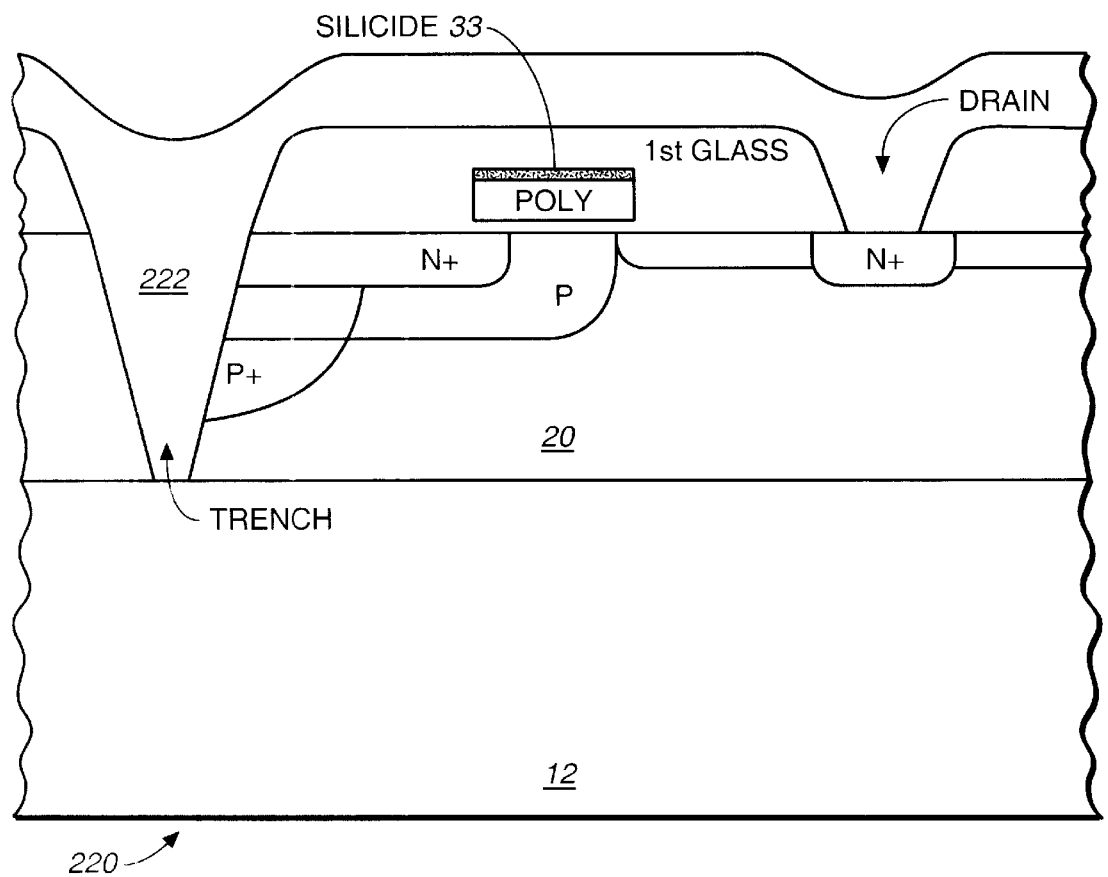
FIG._16

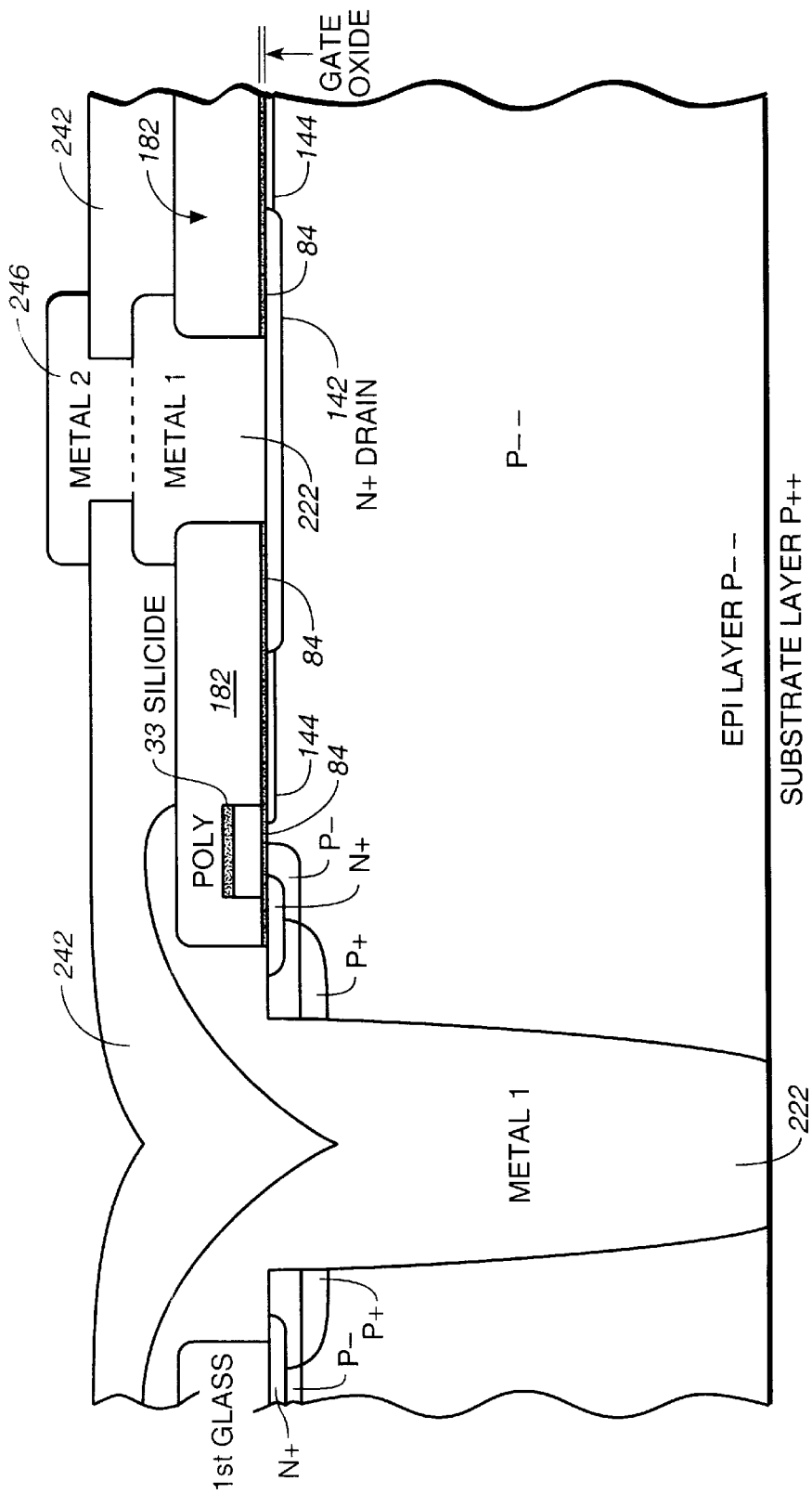
FIG._17

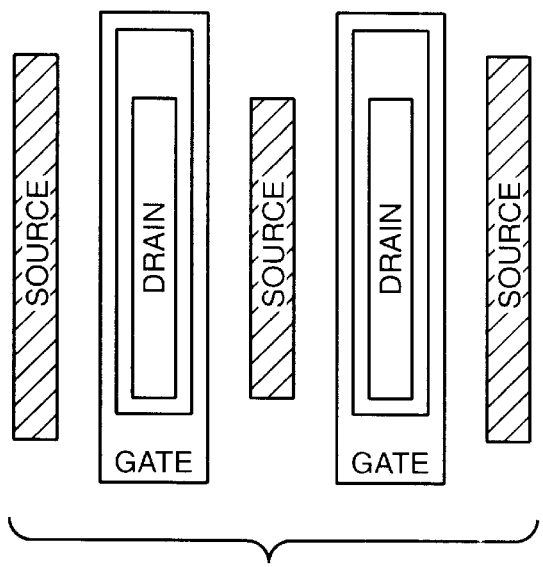
FIG._18
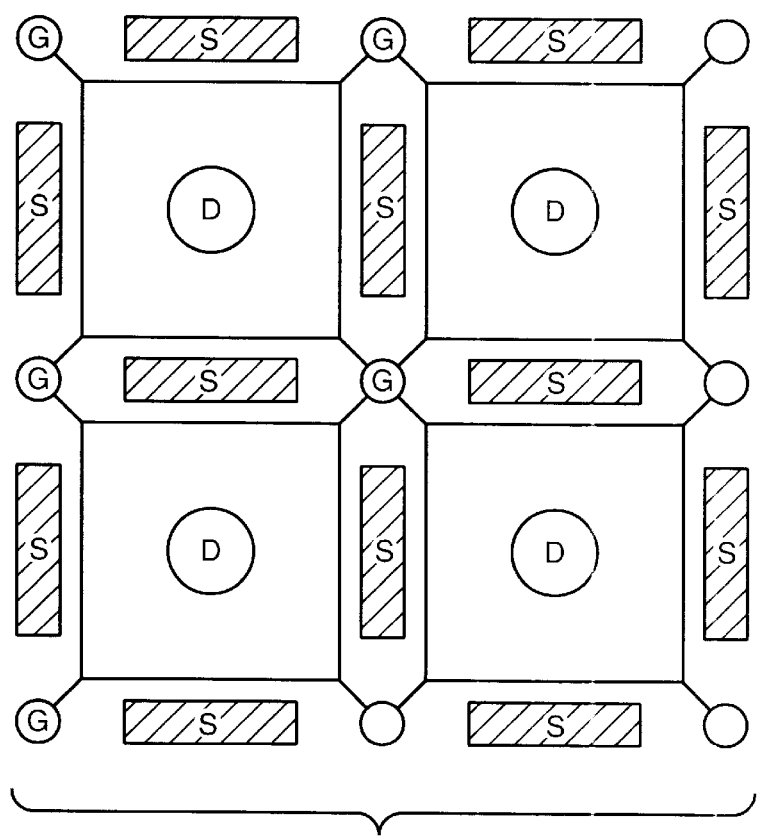
FIG._19

FABRICATION OF LATERAL RF MOS DEVICES WITH ENHANCED RF PROPERTIES

This is a continuation-in-part of the U.S. patent application entitled "METHOD FOR FABRICATING LATERAL RF MOS DEVICES WITH ENHANCED RF PROPERTIES", Ser. No. 09/293,431, filed on Apr. 16, 1999, which is a continuation-in-part of the U.S. patent application entitled "METHOD FOR FABRICATING A LATERAL RF MOS DEVICE WITH A NON-DIFFUSION SOURCE—BACKSIDE CONNECTION", Ser. No. No. 09/072,393, filed on May 4, 1998.

BACKGROUND

The current patent application incorporates in its entirety the U.S. Pat. No. 5,900,663, entitled "Quasi-Mesh Gate Structure for lateral RF MOS Device", and the patent application entitled "A Source Connection for lateral RF MOS Devices", Ser. No. 09/020,257.

Power high frequency devices have been built using a variety of semiconductor technologies. For a long time the preferred vehicle for their realization has been the NPN bipolar junction transistor (BJT). Its primary advantage was the achievable high intrinsic transconductance ($g_m$) that permitted the fabrication of high power devices utilizing small silicon areas.

As processing technology improved, in the early 1970's a number of MOSFET vertical structures begun to challenge the dominance of the BJT at the lower RF frequencies, trading the cost of the large silicon area, necessary to provide the current capability in MOSFETs, for the cost of simple processing. The advantages that the MOSFET structure provided to the user were: higher power gain, ruggedness (defined as the capacity to withstand transients) and ease of biasing.

In the continuous quest for high frequency operation at high power the MOSFET structure has displaced the BJT since the early 1970's in applications where its performance has been competitive.

Recently, new RF MOS devices from several vendors have been placed on the market. The RF MOS device utilizes the standard lateral MOS device with a diffused via that connects the source and the body to the back side of the chip such that the backside becomes both electrical and thermal ground. The prior art RF MOS device structure also uses a polysilicide gate process as a compromise between the fabrication benefits of the self aligned polysilicon gate and the high frequency performance of the metal gate structure. The prior art RF MOS structure has extended the frequency of operation of MOS devices into the 2 GHz region thus covering two frequency bands of great commercial importance: the cellular and PCS/PCN mobile telephone bands.

In the incorporated U.S. patent application entitled "A Source Connection for lateral RF MOS Devices", Ser. No. 09/020,257, the vertical geometry design of the existing RF MOS devices was further improved. This was done by connecting the source and the body of the RF MOS device to the backside of the silicon substrate using a metal plug thus reducing the space needed for that connection. The metal plug design allows a design engineer to utilize more of the RF MOS device active area per unit chip area, to increase the output power per unity chip area, to further decrease the drain-source capacitance ($C_{ds}$), and to increase the bandwidth (BW) of the RF MOS device in the amplifier mode of operation.

In terms of horizontal geometry, the prior art bipolar junction transistor (BJT) used two basic geometries: the interdigitated geometry and the mesh geometry. The interdigitated BJT structure is a set of parallel rows of emitters stripes placed inside a base area. The mesh geometry is similar to the interdigitated but includes connections between emitter stripes.

Traditionally, the RF MOS transistor had the BJT interdigitated horizontal geometry with polysilicon fingers (gate), drain contact in the middle, and the source on both sides. In this geometry, the current moves from the source (from the bottom) to the drain under the gate. The problem with this structure is that the signal had to feed a very long and narrow gate finger. Specifically, the ratio of the length of the gate finger (50–100)$\mu$ to the width of the gate finger (1$\mu$) was about (50–100). For the prior art polysilicon gate fingers with (50–100 squares) and with the resistivity per square of (20 $\Omega$/square), the resistivity was too high 20×100=2,000 $\Omega$, so that different portions of the gate were not fed equally. Depending on the frequency and the resistivity of the material, some portions of the gate were not used at all.

The finger also adds a sizable capacitance component to the channel. Such combination acts as a voltage divider lowering the magnitude of the effective signal entering the device.

On the other hand, all portions of a metal gate with the resistivity per square of 0.1 ($\Omega$/square) could be fed very efficiently up to very high frequencies.

Thus, one solution to this problem is to put silicide on the polysilicon gate finger, that is to put metal like tungsten (Tg), titanium (Ti), cobalt (Co), or platinum (Pl) on the polysilicon. If high enough temperature is applied, the metal and the polysilicon mix and form the silicide. The resistivity per square of the silicided gate is significantly decreased comparatively with the polysilicon gate. Indeed, the resistivity per square for the tungsten silicided gate is (2 $\Omega$/square), for the titanium silicided gate is 1 ($\Omega$/square), for the cobalt silicided gate is (1–2) ($\Omega$/square), and for the platinum silicided gate is (1–2) ($\Omega$/square).

The silicided gate is adequate for a broad range of frequencies. For instance, the silicided gate fingers in the prior art RF MOS devices could be fed very efficiently at cellular 900 MHz frequencies. However, at higher frequencies, in the range of 2 GHz needed for operation of the personal communication services devices (PCS), the long silicided gate is still not adequate because it can not be fed equally.

In the incorporated U.S. Pat. No. 5,900,663, entitled "Quasi-Mesh Gate Structure for lateral RF MOS Device", the horizontal geometry design of the prior art RF MOS devices at high frequencies was further improved by reducing the length of the silicided gate fingers.

In the U.S. patent application entitled "METHOD FOR FABRICATING A LATERAL RF MOS DEVICE WITH A NON-DIFFUSION SOURCE—BACKSIDE CONNECTION", Ser. No. 09/072,393, that is incorporated in its entirety in the present patent application, a method of fabrication a lateral RF MOS device having a non-diffusion source-backside connection and having an interdigitated or a quasi-mesh silicided gate structure was disclosed.

However, the method disclosed in the U.S. patent application entitled "METHOD FOR FABRICATING A LATERAL RF MOS DEVICE WITH A NON-DIFFUSION SOURCE—BACKSIDE CONNECTION", the common problem is the electrical shorts between the polysilicon gate and the source and/or drain areas.

What is needed is the method of fabrication of lateral RF MOS devices, wherein the electrical shorts between the polysilicon gate and the source and/or drain areas are minimized, and accordingly, the yield of fabrication of lateral RF MOS devices per silicon wafer is maximized.

SUMMARY

The present invention is unique because it discloses methods of fabrication of a lateral RF MOS device having a non-diffusion source-backside connection and either interdigitated or quasi-mesh silicided gate structure, wherein the electrical shorts between the polysilicon gate and the source and/or drain areas are minimized, and accordingly, the yield of fabrication of lateral RF MOS devices per silicon wafer is maximized.

One aspect of the present invention is directed to a method of forming a lateral RF MOS device with a non-diffusion source-substrate connection starting from a substrate of a first conductivity type.

In one embodiment, the method comprises the following steps: (a) forming an epitaxial (epi) layer of a first conductivity type; (b) forming a conductive gate of the RF MOS device; (c) forming a body contact region of the RF MOS device; (d) forming a body region of the RF MOS device; (e) forming an enhanced drain drift region of the RF MOS device; (f) forming a drain region of the RF MOS device; (g) forming a source region of the RF MOS device; (h) forming a conductive plug region in the source region and in the body region of the epi layer; and (i) forming a plurality of metal contacts to an outside circuitry.

In another embodiment, a method of forming a lateral RF MOS device with a non-diffusion source-substrate connection starting from a substrate comprises the following steps: (a) providing a semiconductor substrate having a principal surface and being of a first conductivity type; (b) growing an epi silicon layer on a top surface of the substrate; (c) growing a field oxide layer on a top surface of the epi layer; (d) forming a plurality of polysilicided gates; (e) forming a plurality of gate channels; (f) forming a plurality of drain regions and a plurality of source regions; and (g) forming a plurality of metal contacts connecting the plurality of gate channels, the plurality of drain regions and the plurality of source regions with an outside circuitry.

In one embodiment, the polysilicided gate is formed by: (1) removing a part of the silicon nitride layer and a part of the first oxide layer from the active area; (2) growing a gate oxide layer in the active device area; (3) making deposit of a polysilicon layer; (4) making a deposit of silicon nitride layer; (5) using a second mask on the polysilicon layer and on the silicon nitride layer to make a pattern gate structure; (6) oxidizing selectively sides of the polysilicon gate; (7) removing a top part of the silicon nitride layer; (8) depositing a siliciding metal selected from the group consisting of platinum, cobalt, tungsten, and titanium; (9) heating to form the metal silicide layer; and (10) removing the unsilicided metal.

In one embodiment, a body contact region is formed by implanting $P^{30}$ boron dopant into the epi layer, and a body region is formed by implanting P boron dopant into the epi layer. A channel region under the gate is formed by diffusing the body contact region and the body region. An enhanced drift region is formed by implanting N phosphorous dopant into the epi layer. The drain region and the source region are formed by implanting $N^+$ arsenic dopant into the epi layer.

In one embodiment, the lateral RF MOS device with a non-diffusion source-substrate connection and having a quasi-mesh structure can be fabricated. A trench in the epi layer is made and a first metal is deposited in the trench in order to connect each source and body contact areas to the substrate. A first metal mask is used to pattern a plug inside the trench and to form a plurality of metal contacts connected to each drain and to each gate. After depositing a second insulating layer, a via mask is used to contact each drain and gate region. A second metal mask is used to pattern the plurality of metal contacts connected to each drain and to each gate. A third insulating layer is deposited, and a pad mask is used to open the third insulating layer in order to make connections between drain and gate areas and the outside circuitry.

In another embodiment, a lateral RF MOS device with a non-difflusion source-substrate connection and having an interdigitated gate structure can be fabricated. A trench in the epi layer is made and a first metal is deposited in the trench in order to connect each source and body contact areas to the substrate.

A first metal mask is used to pattern a plug inside the trench and to form a plurality of metal contacts connected to each drain and to each gate.

In one embodiment, after depositing a second insulating layer and after making a pad mask to open the second insulating layer, a plurality of metal areas are exposed to connect drain and gate to the outside circuitry.

In another embodiment, after depositing a second insulating layer, a via mask is used to contact each drain and gate region. A second metal mask is used to pattern the plurality of metal contacts connected to each drain and to each gate. A third insulating layer is deposited, and a pad mask is used to open the third insulating layer in order to make connection between drain and gate areas and the outside circuitry.

BRIEF DESCRIPTION OF THE DRAWINGS

FIG. 1 depicts a side view of the lateral RF MOS device having a non-diffusion connection between each source region and the substrate.

FIG. 2 shows the steps of growing an epi layer, an oxide layer, and a silicon nitride layer on a heavily Boron doped silicon substrate.

FIG. 3 illustrates usage of a first mask to protect an active device area and to form a field area of the device.

FIG. 4 depicts boron $P^+$ dopant implantation in the open field areas.

FIG. 5 shows a process of forming a polysilicon gate region in the active area (after field oxide formation) by growing a gate oxide, a blanket polysilicon deposition, and a blanket silicon nitride deposition.

FIG. 6 depicts a process of forming a gate structure comprising a plurality of individual gates.

FIG. 7 illustrates formation of a body contact region in the epi layer of the device for a single gate area of FIG. 6.

FIG. 8 illustrates formation of a body region in the epi layer of the device for a single gate area (56) of FIG. 6.

FIG. 9 shows formation of an enhancement drain drift region in the epi layer of the device for a single gate area (56) of FIG. 6.

FIG. 10 shows how the channel region inverses its polarity if the threshold gate voltage is applied to the device.

FIG. 11 depicts one embodiment, wherein there is no gap between the channel region and the drain enhancement region.

FIG. 12 illustrates formation of a source region and a drain region in the epi layer of the device for a single gate area of FIG. 6. A short oxidation step is performed during the activation thermal step of the drain and source N implants.

FIG. 13 depicts the formation of a first insulating layer to cover all source, drain and gate regions.

FIG. 14 shows formation of a plurality of openings in the first insulating layer by using a contact mask.

FIG. 15 illustrates usage of a trench mask over the contact mask in order to connect each source area to the substrate.

FIG. 16 depicts the deposition of the first metal layer inside each trench area.

FIG. 17 is the side view of the lateral RF MOS device structure.

FIG. 18 is a top view of the lateral RF MOS device having an interdigitated gate structure.

FIG. 19 is a top view of the lateral RF MOS device having a quasi-mesh structure.

FULL DESCRIPTION OF THE PREFERRED EMBODIMENTS

The present invention discloses methods of fabrication of a lateral RF MOS device (10) shown in FIG. 1.

In one embodiment, a lateral RF MOS device (10 of FIG. 1) with a non-diffusion source-substrate connection and having an interdigitated gate structure is fabricated.

In another embodiment, a lateral RF MOS device (10 of FIG. 1) with a non-diffusion source-substrate connection and having a quasi-mesh structure is fabricated.

At first, we present a brief description of the lateral RF MOS device (10) having a non-diffusion connection between each source region (26) and body contact (30) and a substrate (12) as depicted in FIG. 1. As was stated above, the full description of the device (10) of FIG. 1 is disclosed in the U.S. Pat. No. 5,900,663, entitled "Quasi-Mesh Gate Structure for lateral RF MOS Device", and in the patent application entitled "A Source Connection for lateral RF MOS Devices", Ser. No. 09/020,257. Both, the patent and the patent application, are incorporated in the present patent application in their entireties.

The device structure (10) comprises the substrate (12) of a first conductivity type having a substrate resistivity in the range of (0.005 to 0.01) (ohm·centimeter). The device (10) further comprises an epi layer (20) including a semiconductor material of a first conductivity type. The epi layer has an epi layer resistivity of (20 to 30) (ohm·centimeter) and a top surface (36).

In one embodiment (P-embodiment), the substrate's concentration type is P type (that is the majority carriers are holes), and the dopant concentration of the substrate is $P^{++}$, wherein (++) indicates that the dopant concentration $P^{++}$ of holes in the substrate (12) is large comparatively with the hole concentration $P^-$ in the body region (28). The epi layer's conductivity type is also P-type in this embodiment. The dopant concentration of the epi layer is $P^{--}$, wherein (−−) indicates that the dopant concentration $P^{--}$ of holes in the epi layer (20) is small comparatively with the hole concentration $P^-$ in the body region (28).

In another embodiment of the present invention (N-embodiment), the substrate's conductivity type is N type (that is, the majority carriers are electrons), and the dopant concentration of the substrate is $N^{++}$, wherein (++) indicates that the dopant concentration $N^{++}$ of electrons in the substrate (12 of FIG. 1) is large compared with the electrons concentration $N^-$ in the body region (28 of FIG. 1).

In this embodiment, the epi layer (20) includes a semiconductor material of N conductivity type having a dopant concentration $N^{--}$. The N-corresponding concentration values in this N-embodiment are equal to the P-concentration values in the P-embodiment.

A conductive gate (34) overlies the top surface (36) of the epi layer. The gate (34) is insulated from the semiconductor material by a gate silicon dioxide layer (32).

In one embodiment, the gate comprises a polysilicided gate.

The region (22) comprises an enhanced drain drift region of the RF MOS structure. The region (22) is formed completely within the semiconductor material (20). The enhanced drain drift region (22) has N conductivity type (if the epi layer has P conductivity type and vice versa) and has a dopant concentration $N^-$. The enhanced drain drift region increases the drain-to-source breakdown voltage of the RF MOS device (10).

A drain region (24) is also formed in the semiconductor material (20). The drain region (24) has the N conductivity type (if the epi layer has P conductivity type and vice versa). The drain region (24) has a dopant concentration $N^+$ that is greater than the dopant concentration $N^-$ of the enhanced region (22). The drain region (24) contacts the enhanced region (22).

A body region of the RF MOS device (28 of FIG. 1) is also formed in the epi layer. The body region (28) has P conductivity type (if the epi layer has P conductivity type and vice versa). The body region has a dopant concentration $P^-$ that is equal or greater than the dopant concentration $P^{--}$ of the epi layer (20).

The source area includes the body region (28) and a source region (26) being of N conductivity type (if the epi layer has P conductivity type and vice versa) and having a dopant concentration $N^+$.

The source area also includes a body contact region (30) being of P conductivity type (if the epi layer has P conductivity type and vice versa) and having a dopant concentration $P^+$ that is greater than the dopant concentration $P^-$ of the body region (28).

A conductive plug region (38) is formed in the source-body region of the semiconductor material.

In one embodiment, the conductive plug region (38) in the source area connects the source region (26) and the body contact region (30) to the backside of the RF MOS device.

In one embodiment (not shown), the conductive plug region (38) connects the top lateral surface (36) of the source region and body contact region (30) to a highly conductive substrate (12) of the RF MOS device (10).

In another embodiment, as depicted in FIG. 1, the conductive plug region (38) connects a top of the source region and a lateral surface (36) of the body contact region to an interface (21) between a highly conductive substrate (12) of the RF MOS device and the epi layer (20).

Yet, in one more embodiment (not shown), the conductive plug region comprises two elements. The first element of the plug connects a top of the source region and a lateral surface (36) of the body contact region to the interface (21) between the highly conductive substrate (12) of the RF MOS device and the epi layer (20). The second element of the plug connects the backside (23) of the substrate (12) with the interface (21).

The conductive plug can comprise a metal plug or a silicided plug.

The silicided plug can comprise a tungsten silicided plug, a titanium silicided plug, a cobalt silicided plug, or a platinum silicided plug.

The usage of a conductive plug in the lateral RF MOS transistor structure (10) of FIG. 1 allows one to make a good ohmic source area to backside contact in a small area of an RF MOS device without having long thermal cycles needed in case of using a diffusion dopant plug. Thus, the usage of a conductive plug prevents the movement of the substrate dopant and betters the usage of the small areas of the MOS device. The better usage of small areas allows a design engineer to increase the density of the RF MOS structures that can be placed per inch$^2$.

Now we address the methods of fabrication of the device (10) of FIG. 1. As depicted in FIG. 2 (40), a method of forming a lateral RF MOS device with a non-diffusion source-substrate connection starts by providing a substrate (12) having a principal surface (21).

In one embodiment, the silicon substrate (12) is heavily Boron doped (P$^{++}$) with a resistivity in the range of (0.005 to 0.01) (ohm·centimeter).

The next step is to grow a thin epi silicon layer (20) on the top surface (21) of the substrate (12).

Epitaxy is a high temperature chemical vapor deposition (CVD) process. Chemical vapor deposition (CVD) process is the process in which a film is deposited by a chemical reaction or decomposition of a gas mixture at elevated temperature at the wafer surface or in its vicinity. The typical examples of CVD films are a single crystal silicon film, a polycrystalline silicon film, a silicon dioxide film, and a silicon-nitride film. CVD can be performed at atmospheric pressure (APCVD), or at low pressure (LPCVD).

As was mentioned above, epitaxy is a high temperature chemical vapor deposition (CVD) process where a single crystal layer is deposited on a single crystal substrate. Epitaxy is the arrangement of atoms on an ordered substrate which acts as the seed crystal. The atoms produced by the gas reaction impinge on the substrate surface and move around until they find the correct location to bond to the surface atoms, forming a layer of the same crystallographic arrangements as the substrate.

In one of the typical applications of epitaxial deposition, a lightly doped layer is deposited on a heavily doped substrate. The lightly doped layer is the region where active devices are constructed and the heavily doped substrate constitutes a low resistance circuit path.

For the complete reference, please, see "Fundamentals of Semiconductor Processing Technologies" by Badih El-Kareh, IBM Corporation, published by Kluwer Academic Publishers in 1995.

The epi layer can be intentionally doped while grown by adding controlled amounts of the dopant compounds to the gas stream. Typical dopant sources are hybrids of the impurity, such as phosphine (PH$_3$), arsine (AsH$_3$), antimonine (SbH$_3$), and diborane (B$_2$H$_6$).

In one embodiment, the epi silicon layer (20), about 3–12 microns thick and of a resistivity of (20 to 30) (ohm·centimeter), is grown on the top surface (21) of the substrate (12) in the presence of diborane (B$_2$H$_6$). This process results in a lightly Boron doped (P$^{--}$) epi silicon layer (20).

In the next step, a thin layer (500 Å) of silicon dioxide (42) is grown by oxidizing the silicon surface (36) in a high temperature furnace.

At the following step, a layer (1000 Å) of silicon nitride (44) is deposited by utilizing the chemical vapor deposition (CVD) process.

As shown in FIG. 3, a first mask operation (66) can be utilized to protect an active device area (64) and to form a field area (62) by removing the silicon nitride and silicon oxide areas from the unprotected regions (62).

In one embodiment, the first mask operation can be executed by utilizing different tools of optical lithography including an ultra violet (UV) light source, a photomask, an optical system, and a wafer covered with a photosensitive layer, called resist because of its ability to resist chemicals used in subsequent processing.

The photomask for optical lithography includes a transparent plate, called blank, covered with a patterned film of opaque material. The blank is made of soda lime, borosilicate glass, or fused quartz. The opaque material is typically a very thin (<100 nm) film of chrome, covered with an anti-reflective coating (ARC), such as chrome oxide, to suppress interferences at the surface area. The photomask mask is flooded with UV light and the mask pattern is imaged onto the resist by the optical system.

After the proper photomask is designed, the whole surface area of silicon nitride is covered with photoresistive chemical. After the exposure to the UV light, the image of the active area (64) is developed. The nitride and oxide areas from the unprotected regions (62) can be removed by plasma or wet chemical etching (PCE).

During the next step (72), as depicted in FIG. 4, boron P$^+$ dopants can be implanted in the open field areas (62) by using ion implantation process with Boron ions having 80 keV energy and a dose of 1·10$^4$ ions/cm$^2$. After boron implantation is completed, the resist is stripped away.

The field area (62) oxidation can be performed in a high temperature furnace at 950° C. to cover the field areas (62) with the grown (15,000 Å) layer of silicon dioxide (82 of FIG. 5).

The given immediately above number (15,000 Å) for the thickness of the silicon dioxide layer, as well as all other numbers in the current disclosure, are to be understood only as the best mode of the invention at the time the invention has been made.

The next step of forming a polysilicided gate is shown in FIGS. 5 and 6. Firstly, the silicon nitride layer (44 of FIG. 2) and the first oxide layer (42 of FIG. 2) are removed from the active area (64) by a plasma or wet chemical etching (PCE) process.

The next step is a step of growing a gate oxide layer (84 of FIG. 5), that is between (600 to 700) (Å) thick, in the active device area (64) by oxidation in a high temperature furnace at (850 to 1000)° C.

At the next step, the deposit of a polysilicon layer (86 of FIG. 5), that is 4000 Å thick, is made by using a chemical vapor deposition (CVD) process. Phosphorous is implanted into the polysilicon layer afterwards with an energy of 80 keV and a dose of 5·10$^5$ ions/cm$^2$. Then, a thin layer of silicon nitride (about 500 Å) (88 of FIG. 5) is deposited on the top of the silicon by CVD process.

Using a second mask (92 of FIG. 6) on the silicon nitride/polysilicon layers sandwich (88, 86 of FIG. 5), one can pattern a gate structure (55, 56 of FIG. 6).

FIG. 7 illustrates the next step in the formation of the device for a single gate area (56) of FIG. 6. A third mask (102) is utilized in order to select an area of the epi layer for implanting P$^+$ boron dopant.

The P$^+$ boron dopant is implanted into the selected area by the third mask area of the epi layer by using ion implantation process with Boron ions having 80 keV energy and a dose of 5·10$^5$ ions/cm$^2$ to form one of the body contact regions (104) of the device. After boron implantation is completed, the resist (102) is stripped away.

FIG. 8 depicts the next step in the formation of the device for a single gate area (56) of FIG. 6.

At first, a fourth photoresist mask can be utilized in order to select an area of the epi layer for implanting P boron dopant. Next, the P boron dopant can be implanted into the selected area by the opening in the mask area by using ion implantation process with Boron ions having 50 keV energy and a dose of $(2-4) \cdot 10^3$ ions/cm$^2$ to form one of the body regions (116) of the device. After the boron implantation is completed, the resist (102) is stripped away.

A step of diffusing the body contact region (104 of FIG. 7) and the body region (116 of FIG. 8) should be performed to form a channel region (122 of FIG. 10) under one of the gates (56 of FIG. 6). The diffusion is performed by a short thermal cycle in a high temperature furnace in the range of (1050 to )° C. Both implants, P$^+$ boron dopant and P boron dopant, are activated by the diffusion process. The channel vertical depth is 1.0 microns.

As shown in FIG. 10, the channel region (122) initially has the same type of conductivity (P in one embodiment) as the body region.

However, as disclosed in the patent application entitled "A Source Connection for lateral RF MOS Devices", Ser. No. 09/020,257, if the threshold gate voltage $V_t$ is applied (130 of FIG. 10), the channel inverses its conductivity from P to N thus creating the continuous conductive channel between the N$^+$ source (132) and the N$^+$ drain (142).

The gate voltage $V_{GS}$, required to produce an inversion layer, is called the threshold voltage $V_t$.

In one embodiment of the RF MOS device (10 of FIG. 1), as depicted in FIG. 11, there is no gap between the body region (116) and the enhancement drift region (144).

FIG. 9 illustrates the next step in the formation of the device for a single gate area (56) of FIG. 6.

A fifth photoresist layer (124) can be utilized to select an area in the epi layer for implanting N phosphorous dopant. The N phosphorous dopant can be implanted into the selected area of the epi layer by using ion implantation process with phosphorous ions having 140 keV energy and a dose of $2 \cdot 10^2$ ions/cm$^2$ to form one of the enhanced drift regions (144) of the device. After the phosphorous implantation is completed, the resist is stripped away.

FIG. 12 depicts the next step in the formation of the device for a single gate area (56) of FIG. 6.

A sixth photoresist layer (164 of FIG. 12) can be utilized to select an area of the epi layer for implanting N$^+$ arsenic dopant. The N$^+$ arsenic dopant can be implanted into the area of the epi layer selected by the sixth layer mask area by using ion implantation process with arsenic ions having 180 keV energy and a dose of $1 \cdot 10^6$ ions/cm$^2$ to form a drain region (142 of FIG. 12) and to form a source region (132 of FIG. 12) of the device. After the arsenic implantation is completed, the resist is stripped away.

The distance between the drain edge of the gate and the N$^+$ diffusion side edge is selected in combination to the drain drift region implant to support the desired drain-source breakdown voltage.

In one embodiment, the distance between the drain edge of the gate and the N$^+$ diffusion side edge is selected to be in the range of (3 to 4) microns with a drift region implant dose of $(1.7 \text{ to } 2.5) \cdot 10^2$ ions/cm$^2$ at 140 keV energy.

The next step is a step of diffusing the drain region (142 of FIG. 12) and the source region (132 of FIG. 12). The diffusion is performed by a second short thermal cycle in a partly oxidizing atmosphere (such as 5 minutes exposure to wet oxide followed by 10 minutes exposure to dry nitrogen) in a high temperature furnace at 950° C. in order to activate the implanted dose and to grow a protective oxide layer on the sides of the polysilicon gate structure (165 of FIG. 12). The vertical depth of the diffused drain and source regions is (0.25–0.35) microns.

The next step is the step of removing the silicon nitride "cap" formed on the top of the polysilicon gate by a selective means (such as boiling hot phosphoric acid) to open up the area for the silicidation process.

Finally, a siliciding metal selected from platinum, tungsten, cobalt or titanium, can be deposited on the gate pattern and subsequently processed to form a metal silicide layer. The unsilicided metal can be removed by selective chemical etching.

In one embodiment, the lateral RF MOS device having an interdigitated gate structure (as shown in FIG. 18) can be fabricated.

A first insulating layer (182 of FIG. 13), that is 10,000 Å thick, is deposited to cover all source, drain, and gate regions.

The insulating layer can comprise a layer of silicon dioxide doped by phosphorous or boron, undoped silicon dioxide, silicon nitride, or a mixture of silicon dioxide and silicon nitride.

FIG. 14 depicts formation of contact openings in the first insulating layer of the device by using a contact mask. The unprotected insulating areas (193) are removed by plasma chemical etching (PCE). As a result, the first insulating layer (182 of FIG. 13) is open in contact areas to each drain, source, and gate (not shown) regions.

FIG. 15 illustrates usage of a trench photoresist mask (210) over the contact area (192) in order to connect each source area and body contact area to the substrate (12). The unprotected areas (212) can be removed by plasma chemical etching (PCE). The first metal layer (222 of FIG. 16) (1.5 microns thick) can be deposited inside each trench area by using a sputtering process.

Sputtering is similar to a billiard-ball event. Ions are accelerated in an electric field toward a target of material to be deposited, where they "knock-off" (sputter) target atoms. The sputtered ions then deposited onto wafers which are conveniently placed facing the target. Argon ion (Ar$^+$) is typically used for sputtering because it is inert and readily available in a pure form. It is ionized by colliding with high energy electrons in the chamber, and then accelerated in an electric field toward the negatively biased target. The momentum of ions incident on the target is then transferred to the surface atoms of the target material, causing ejection. Therefore, during sputter deposition, material is removed from the target and deposited onto wafers.

After making a first metal deposit (222 of FIG. 16) in the trench area, one can use a first metal mask to pattern a plug inside each trench in order to form a plurality of metal contacts connected to each source, to each drain and to each gate. A metal in the unprotected areas can be removed by plasma chemical etching (PCE).

Next, a second insulating layer (242 of FIG. 17), 10000 Å thick, can be deposited.

Finally, a pad mask can be utilized to open the second insulating layer (242 of FIG. 17) in order to connect a plurality of metal connections patterned by the first metal mask and the outside circuitry.

In another embodiment, the lateral RF MOS device having a quasi-mesh structure of FIG. 19 can be fabricated, A first insulating layer (182 of FIG. 13), that is 10,000 Å thick, can be deposited to cover all source, drain, and gate regions.

FIG. 14 depicts formation of the open contact areas in the first insulating layer by using a contact mask. The unprotected areas (193) can be removed by plasma chemical etching (PCE).

As a result, the first insulating layer (182 of FIG. 13) is open in contact areas to each drain, gate and source region.

FIG. 15 illustrates usage of a trench photoresist mask (210) over the contact mask (192) in order to connect each source area to the substrate (12). The unprotected areas (212) can be removed by plasma chemical etching (PCE). The first metal layer (222 of FIG. 16) (1.5 microns thick) can be deposited inside each trench area by using a sputtering process.

After making a first metal deposit, one can use a first metal mask to pattern a plug inside each trench as well as to form a plurality of metal contacts connected to each drain and to each gate. The unprotected metal can be removed by plasma chemical etching (PCE).

Next, a second insulating layer (242 of FIG. 17), 10,000 Å thick, can be deposited.

A via photoresist mask can be utilized to open each contact region in each drain region, and each gate region. The unprotected areas of the second insulating layer can be removed by plasma chemical etching (PCE).

In the next step, a second metal layer (246 of FIG. 17) (1.5 microns thick) can be deposited using a sputtering process.

A second metal mask can be used to pattern a plurality of metal connections to each drain and to each gate. The unprotected metal can be removed by plasma chemical etching (PCE).

A third insulating layer (not shown), that is 10,000 Å thick, can be deposited to cover all source, drain, and gate regions.

Finally, a pad mask can be utilized to open the third insulating layer in order to connect a plurality of metal connections patterned by the second metal mask and the outside circuitry.

Thus, the U.S. patent application entitled "METHOD FOR FABRICATING A LATERAL RF MOS DEVICE WITH A NON-DIFFUSION SOURCE—BACKSIDE CONNECTION", Ser. No. 09/072,393, disclosed the manufacturing process, wherein a polysilicon gate structure including a silicide on top and on both sides of each gate was fabricated. Therefore, during this above mentioned manufacturing process, the undesired shorts between source and gate regions and between drain and gate regions (pinholes) could occur. The defective RF DMOS devices had to be isolated and the manufacturing yield was not optimized.

In the present patent application, both sides of each gate are oxidized thus preventing possible shorts between source and gate regions and between drain and gate regions. The top of each gate can still be silicided once the protective layer of silicon nitride is removed.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A method of forming a lateral RF MOS device with a non-diffusion source-substrate connection starting from a substrate, said lateral RF MOS device having enhanced RF properties, said method comprising the steps of:

providing a semiconductor substrate having a principal surface and being of a first conductivity type;

growing an epi silicon layer on a top surface of said substrate, said epi layer having a first conductivity type;

growing a field oxide layer on a top surface of said epi layer;

forming a polysilicon gate;

forming a plurality of gate channels;

forming a plurality of drain regions and a plurality of source regions;

forming a silicided layer on said polysilicon gate; and and forming a plurality of metal contacts for connecting said plurality of gate channels, said plurality of drain regions and said plurality of source regions with an outside circuitry.

2. The method of claim 1, wherein said step of growing said field oxide layer on said top surface of said epi layer further comprises the steps of:

growing a first layer of silicon dioxide;

depositing a layer of silicon nitride;

using a first mask to remove a part of said silicon nitride layer, to remove a part of said silicon dioxide layer, to mask an active device area and to form a field area;

implanting boron $P^+$ dopant in said open field area; and oxidizing said field area.

3. The method of claim 2, wherein said step of forming said polysilicon gate further comprises the steps of:

removing a part of said silicon nitride layer and a part of said first oxide layer from said active area;

growing a gate oxide layer in said active device area;

making deposit of a polysilicon layer;

making a deposit of silicon nitride layer;

using a second mask on said polysilicon layer and said silicon nitride layer to make a pattern gate structure;

oxidizing selectively sides of said polysilicon gate;

removing a top part of said silicon nitride layer;

depositing a siliciding metal selected from the group consisting of platinum, cobalt, tungsten, and titanium;

heating to form the metal silicide layer; and removing the unsilicided metal.

4. The method of claim 3, wherein a step of forming one said gate channel further comprises the steps of:

making a third mask to prepare a third layer area of said epi layer for implanting $P^+$ boron dopant;

implanting $P^+$ boron dopant into said third layer area of said epi layer to form a body contact region;

making a fourth mask to prepare a fourth layer area of said epi layer for implanting P boron dopant;

implanting P boron dopant into said fourth layer area of said epi layer to form a body region; and diffusing said body contact region and said body region to form a channel region under said gate.

5. The method of claim 4, wherein a step of forming one said drain region and one said source region further comprises the steps of:

making a fifth mask to prepare a fifth layer area of said epi layer for implanting N phosphorous dopant;

implanting N phosphorous dopant into said fifth layer area of said epi layer to form an enhanced drift region;

making a sixth mask to prepare a sixth layer area of said epi layer for implanting $N^+$ arsenic dopant;

implanting N⁺ arsenic dopant into said sixth layer area of said epi layer to form one said drain region and one said source region; and diffusing said enhanced drift region, said source region and said drain region.

6. A method of forming a lateral RF MOS device with a non-difflusion source-substrate connection starting from a substrate, said lateral RF MOS device having enhanced RF properties, said method comprising the steps of:

provideing a semiconductor substrate having a principal surface and being of a first conductivity type;

growing an epi silicon layer on a top surface of said substrate, said epi layer having a first conductivity type;

growing a field oxide layer on a top surface of said epi layer;

forming a polysilicon gate;

forming a plurality of gate channels;

forming a plurality of drain regions and a plurality of source regions;

forming a silicided layer on said polysilicon gate;

depositing a first insulating layer to cover all said source regions, all said drain regions, and all said gate regions;

opening said first insulating layer in contact areas to each said drain region, to each said gate region, and to each said source region by making a contact mask;

using a trench mask to make a trench in said epi layer in order to connect each said source area to said substrate;

making a first metal deposit in said trench;

making a first metal mask to pattern a plug inside said trench and to form said plurality of metal contacts connected to each said drain and to each said gate;

depositing a second insulating layer; and making a pad mask to open said second insulating layer to make connections between said plurality of metal contacts connected to each said drain and each said gate and said outside circuitry;

whereby said lateral RF MOS device having an interdigitated gate structure is fabricated.

7. A method of forming a lateral RF MOS device with a non-diffusion source-substrate connection starting from a substrate, said lateral RF MOS device having enhanced RF properties, said method comprising the steps of:

providing a semiconductor substrate having a principal surface and being of a first conductivity type;

growing an epi silicon layer on a top surface of said substrate, said epi layer having a first conductivity type;

growing a field oxide layer on a top surface of said epi layer;

forming a polysilicon gate;

forming a plurality of gate channels;

forming a plurality of drain regions and a plurality of source regions;

forming a silicided layer on said polysilicon gate;

depositing a first insulating layer to cover all said source regions, all said drain regions, and all said gate regions;

opening said first insulating layer in contact areas to each said drain region, to each said gate region, and to each said source region by making a contact mask;

using a trench mask to make a trench in said epi layer in order to connect each said source area to said substrate;

making a first metal deposit;

making a first metal mask to pattern a plug inside said trench and to form said plurality of metal contacts connected to each said drain and to each said gate;

depositing a second insulating layer;

making a via mask to each said contact region in each said drain region and in each said gate region;

making a second metal deposit;

making a second metal mask to pattern said plurality of metal contacts connected to each said drain and to each said gate;

depositing a third insulating layer; and making a pad mask to open said third insulating layer to make connections between said plurality of metal contacts connected to each said drain and each said gate and said outside circuitry;

whereby said lateral RF MOS device having a quasi-mesh structure is fabricated.

* * * * *